(12) United States Patent
Narita et al.

(10) Patent No.: US 7,554,199 B2
(45) Date of Patent: Jun. 30, 2009

(54) SUBSTRATE FOR EVALUATION

(75) Inventors: Takenori Narita, Mito (JP); Masaki Ito, Hamura (JP); Kenji Sameshima, Hachioji (JP)

(73) Assignee: Consortium for Advanced Semiconductor Materials and Related Technologies, Tokyo (JP)

( * ) Notice: Subject to any disclaimer, the term of this patent is extended or adjusted under 35 U.S.C. 154(b) by 0 days.

(21) Appl. No.: 11/598,537

(22) Filed: Nov. 13, 2006

(65) Prior Publication Data
US 2007/0117386 A1 May 24, 2007

(30) Foreign Application Priority Data
Nov. 22, 2005 (JP) ............... 2005-336586
Jan. 26, 2006 (JP) ............... 2006-017212

(51) Int. Cl.
*H01L 23/52* (2006.01)
(52) U.S. Cl. .............. 257/752; 257/762; 438/692; 438/687; 438/626
(58) Field of Classification Search ........ 438/692, 438/687, 622, 626; 257/750–752, 758, 762, 257/E21.582–E21.584, E23.142
See application file for complete search history.

(56) References Cited

U.S. PATENT DOCUMENTS

| 6,281,114 | B1 * | 8/2001 | Lin et al. ............... 438/633 |
| 6,514,853 | B1 * | 2/2003 | Matsubara ............ 438/626 |
| 2006/0197228 | A1 * | 9/2006 | Daubenspeck et al. ...... 257/773 |

FOREIGN PATENT DOCUMENTS

JP   2001-007114   1/2001

* cited by examiner

*Primary Examiner*—Zandra Smith
*Assistant Examiner*—Paul E Patton
(74) *Attorney, Agent, or Firm*—Jordan and Hamburg LLP

(57) ABSTRACT

The CMP technology is provided for a damascene wiring structure having a plural-layer wiring that is excellent in flatness and resolvability of Cu residue. An evaluation substrate is provided for evaluating the condition of a CMP that is employed for configuring a semiconductor device having a plurality of wirings in a vertical direction, and the evaluation substrate comprises: a substrate; a first groove formed on the substrate; a second groove formed on the substrate; and wiring material provided in the first groove and the second groove, wherein a depth of the second groove is shallower than that of the first groove.

13 Claims, 10 Drawing Sheets

10 %  29 %  50 %  67 %  91 %  99 %

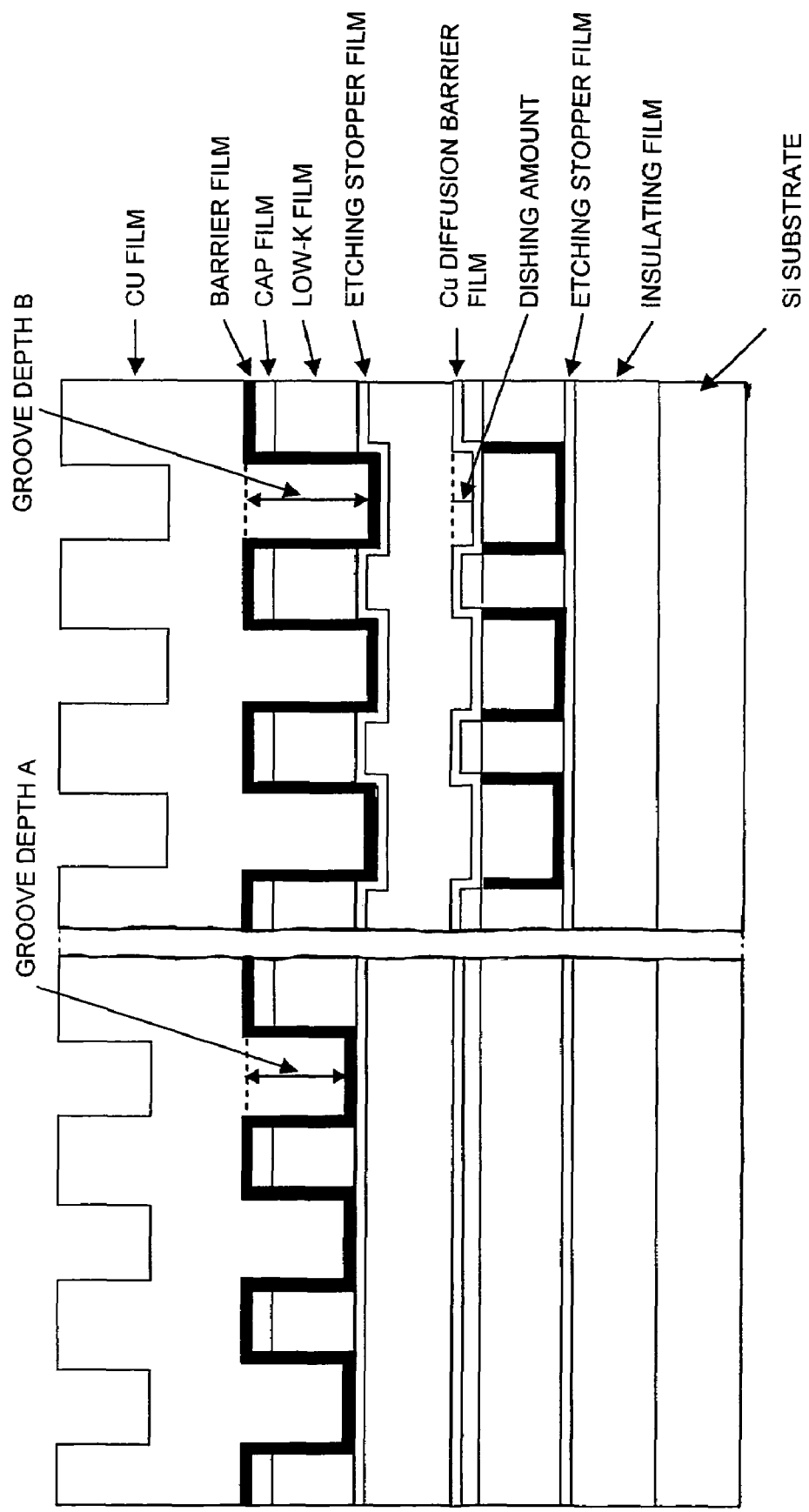

US 7,554,199 B2

SUBSTRATE FOR EVALUATION

BACKGROUND OF THE INVENTION

The present invention relates to a technology for investigating (evaluating) conditions of a CMP (Chemical Mechanical Polishing) for configuring a Cu film in a damascene wiring structure, and more particularly to a substrate for evaluating the CMP that enables the CMP condition to be simply determined. For example, it relates to a CMP technology for providing damascene wiring structure having a plurality of stacked-layer wirings that is excellent in flatness and removability of Cu residue.

In a CMP process of Cu and a barrier film that is employed for forming a multi-layer (stacked-layer) wiring of an LSI, it is necessary to control a film thickness of the Cu wiring within a constant limit in a wide range from a microscopic wiring of 0.1 µm or less to a global wiring of 100 µm or so. Dishing or erosion of Cu and the barrier film that are generated in this CMP process is a large fluctuation factor of the Cu wiring thickness. Accordingly, the CMP allowing a reduction in an amount of the dishing and the erosion is desirable.

The process of forming the Cu wiring is conducted as described below. At first, a Cu diffusion barrier film is formed on a substrate having a wiring groove formed therein. Thereafter, a Cu seed film is formed. Continuously, the Cu film is formed having a thickness one and half times to three times of the depth of the wiring groove with a plating method. Thereafter, the unnecessary film is polished/removed with the CMP. That is, first of all, a slurry for Cu is employed, thereby to polish/remove the Cu film other than the portion that becomes the wiring. And, the polishing is suspended for the time being at the time point that the low-layer Cu diffusion barrier film has been exposed. Next, a slurry that is different from the slurry for Cu is employed, thereby to polish/remove the Cu diffusion barrier film.

In such a technology, the following conditions of (1) and (2) are of importance at the stage that the Cu film has been removed and the Cu diffusion barrier film has been exposed.

(1) Deterioration in flatness due to the dishing and the corrosion is small.

(2) Surplus Cu other than Cu of the portion that becomes a wiring is completely removed.

So as to satisfy these conditions, a method has been proposed which includes, in a state where Cu has been polished, partially leaving the Cu film unpolished and polishing the remaining Cu film simultaneously in polishing the barrier.

In this case, however, it is necessary to set a polishing speed of the barrier film and the Cu film to approximately 1:1.

Carrying out the CMP in such a manner allows the polishing amount of Cu in polishing the Cu diffusion barrier film to be enlarged. As a result, the flatness declines, and further, wiring resistance augments.

It is noted that in forming the multi-layer wiring of the LSI, the groundwork at the time of forming the first-layer (lowest-layer) wiring is relatively flat. However, in forming the wirings in the second layer and the more highly ranked layers (the layers more highly ranked than the first layer), a dimple and a bump is often formed on the surface due to the dishing and the erosion that are generated by the CMP for forming the low-layer wiring. Accordingly, it follows that the wirings of the second layer and the more highly ranked layers (the layers more highly ranked than the first layer) are formed on such a dimple and a bump.

Incidentally, in the CMP of the Cu films of the second layer and the more highly ranked layers, it is necessary to remove completely the surplus Cu in the dimple portion due to the formation of the low-layer wiring in order to prevent a inter-wiring short circuit from occurring. And, removing the Cu residue that locally exists in the foregoing dimple portion necessitates carrying out an over-polishing after the Cu film has been removed and the low-layer barrier film has been exposed. However, depending upon the CMP condition of the Cu film, in some cases, the longer-time over-polishing is necessitated as compared with the case that no dimple and bump exists in the low-layer wiring. As such, the dishing augments as the over-polishing time is prolonged. And, in the polishing process in which the over-polishing time of the more highly ranked layer is prolonged all the more, the dishing of the more highly ranked layer becomes larger. For this, it becomes difficult to form the wiring as designed in a case where numerous wiring layers are provided. Yet, setting the over-polishing time for each wiring layer is necessitated, which complicates a management of the process.

In an attempt to avoid such a problem, a method has been proposed of thickly forming an insulation layer in the half way of the step of forming the multi-layer wiring to carry out the CMP for its insulation layer, thereby allowing the dimple and bump of the groundwork to be flattened.

This technique, however, incurs an increase in the number of steps, which increases the cost.

In the example of JP-P2001-7114A "Semiconductor Device and Production Method thereof", the substrate, which is obtained by forming the wiring groove on a flat substrate to form a metallic film thereupon, is employed as a tool for investigating the CMP.

However, in the evaluation employing such a substrate, no influence of the dimple and bump due to the low-layer wiring at the time of forming the multi-layer wiring as mentioned above is taken into consideration.

As mentioned above, the wafer with a wiring pattern for evaluation conventionally proposed is only a wafer obtained by forming a one-layer wiring on a flat silicon substrate. Accordingly, even though the proposed wafer is employed for investigating the condition in carrying out the CMP, an influence cannot be evaluated of the dimple and bump due to the dishing and the erosion of the low-layer wiring.

Thereupon, it is suggested that the method of forming the multi-layer wiring is employable for the purpose of evaluating an influence of the dimple and bump of the low-layer wiring.

This method, however, necessitates carrying out the CMP again, after carrying out the CMP for forming the first-layer wiring, in order to form the second-layer wiring. For this, it takes a long time to obtain the optimum CMP condition. Thereby, development efficiency declines.

In addition, in the above-mentioned method, the degree of the depth of the dimple due to the low-layer wiring at which Cu is removable, i.e. the margin for removability cannot be confirmed. For this, it is impossible to select the CMP condition having a sufficient margin for removability of the Cu residue in the dimple due to the low-layer wiring.

Thus, developing an evaluation technology that enables an influence of the dimple and bump due to the low-layer wiring to be simply evaluated allows development efficiency in the slurry for the CMP and the CMP process to be improved drastically. Further, in the production of the LSI employing the CMP condition having a wide margin allows its yield to be enhanced.

SUMMARY OF THE INVENTION

Thus, solving of the first problem by the present invention results in a damascene wiring structure having plural-layer wirings that is excellent in flatness and removability of the Cu residue. Particularly, it is an object of the invention to provide the CMP technology for obtaining the damascene wiring structure having the foregoing characteristic. That is, it is to provide the technology that enables the optimum CMP condition to be simply evaluated.

Solving the second problem by practice of the present invention provides technology that enables an influence of the dimple and bump due to the low-layer wiring to be simply evaluated in the CMP process of forming the wiring.

The first and second problems are solved by an evaluation substrate for evaluating the condition of the CMP that is employed for configuring the semiconductor device having a plurality of wirings in a vertical direction, including: a substrate; a first groove formed on the substrate; a second groove formed on the substrate; and a material of the wiring provided in the first groove and the second groove, which is characterized in that the depth of the first groove differs from that of the second groove.

Particularly, the first problem is solved by an evaluation substrate for evaluating the condition of the CMP that is employed for configuring the semiconductor device having a plurality of wirings in a vertical direction, including: a substrate; a first groove formed on the substrate; a second groove formed on the substrate; and a material of the wiring provided in the first groove and the second groove, which is characterized in that the second groove is formed on the side of the first groove, and the depth of second groove is shallower than that of the first groove.

Further, the first problem is solved by an evaluation substrate for evaluating the condition of the CMP that is employed for configuring the semiconductor device having a plurality of wirings in a vertical direction, including: a substrate; a first groove formed on the substrate; a second groove formed on the substrate; and a material of the wiring provided in the first groove and the second groove, which is characterized in that the second groove is formed on the side of the first groove, and upon viewing the first groove and the second groove from an identical reference plane, the depth of the second groove is shallower than that of the first groove.

Yet further, the first problem is solved by the above-mentioned evaluation substrate, which is characterized in that the depth of the second groove is 5 to 60% of that of the first groove.

Yet further, the first problem is solved by the above-mentioned evaluation substrate, which is characterized in being configured so that (the depth of the second groove)≧(the depth of the dishing in the first groove).

Yet further, the first problem is solved by the above-mentioned evaluation substrate, further including a groove similar to the second groove, except that it differs in depth, which is characterized in that the depth of the groove is 5 to 60% of that of the first groove.

Yet further, the second problem is solved by an evaluation substrate for evaluating the condition of the CMP that is employed for configuring the semiconductor device having a plurality of wirings in a vertical direction, including: a substrate; a first groove formed on the substrate; a second groove formed on the substrate; and a material of the wiring provided in the first groove and the second groove, which is characterized in that the second groove is formed on the side of the first groove, and upon viewing the first groove and the second groove from an identical reference plane, the depth of the second groove is deeper than that of the first groove.

Yet further, the second problem is solved by the above-mentioned evaluation substrate, which is characterized in that the depth of the second groove is 105 to 160% of that of the first groove.

Yet further, the second problem is solved by the above-mentioned evaluation substrate, further including a groove similar to the second groove except that it differs in depth, which is characterized in that the depth of the groove is 105 to 160% of that of the first groove.

The CMP is carried out for the material (Cu film) of the wiring of the evaluation substrate configured as mentioned above. By observing this substrate for which the CMP has been carried out, it is determined whether or not the CMP is suitable. That is, by determining whether or not the Cu film provided in the second groove has been removed in the depth of the dishing of the Cu film provided in the first groove, or in the depth deeper than the depth of the above dishing, it can be evaluated whether or not the condition of the CMP is suitable. That is, the condition of the CMP, which enables Cu to be removed from the pattern of which the groove depth is equal to or deeper than the depth of the dishing in the pattern portion equivalent to the Cu wiring after carrying out the above CMP for the Cu film and the Cu diffusion barrier film provided on the evaluation substrate, is set. In other words, carrying out the CMP for the substrate having the plural-layer Cu wirings in the CMP condition that enables the foregoing situation to be obtained does not incur, for example, the trouble such as excessive polishing and a shortage of the polishing.

In the case of employing the present invention for investigating the CMP process of forming the Cu wiring, an L & S (Line & Space) pattern having various groove widths and groove occupancy ratios, and an isolated pattern having various groove widths can be employed in terms of the plane figure as the pattern that is provided on the substrate. The occupancy ratio of the L & S pattern is defined by (width (L) of the groove pattern)/(pitch (L+S) of the groove pattern)× 100%. In the CMP of the Cu film, it is in the case where the wiring width is wide, and yet the wiring occupancy ratio is large, that the dishing becomes largest. And, existence of such a wiring in the low layer causes the Cu residue to be inclined to occur in the CMP for the high layer. It is thinkable that the maximum wiring width in the normal LSI is 100 µm or so, so several kinds of the patterns of which the wiring width is 100 µm or so and of which the wiring occupancy ratio differs are suitably used. Several kinds of the isolated patterns as well of which the wiring width differs can be used and, with the wiring width in this case, 1 to 1000 µm or so is suitable.

It is desirable that the depth of the groove (the first groove) of the pattern having the Cu wiring expected is approximately equalized to the thickness of the wiring of an element (LSI). The thickness of the wiring in the LSI is 150 nm to 2 µm or so. Additionally, the depth of the groove differs depending upon a design rule and the layer (low layer, middle layer, and high layer) of the wiring that is applied, whereby the foregoing depth of the groove is appropriately selected so as to meet the LSI, being a target. Desirably, the depth of the groove (the second groove) of the pattern having the dimple due to the low-layer wiring expected is within a range of 5 to 60% (particularly, 7.5% or more and further, 10% or more. And, 50% or less and further, 40% or less) of the wiring groove depth because the target of the dishing amount is approximately 10% or so of the thickness of the wiring. It is enough that the number of grooves of which the depth is within such a limit is one (1); however two grooves or more are acceptable. Desirably, two to six grooves of which the depth differs in a staged manner within the limit are formed. That is, forming the foregoing grooves plurally enables the more appropriate CMP condition to be evaluated.

The evaluation (decision) of the CMP condition is carried out by, after carrying out the CMP for Cu and the Cu diffusion barrier film, comparing the dishing amount of the pattern having the wiring expected with the status of Cu residue of the pattern having the dimple due to the low-layer wiring expected. The comparison at this time is a comparison between the grooves of the pattern of which the shape is identical except the depth (of which the plan shape is identical). And, as a result of comparison/investigation, the condition that enables Cu residue not to occur in the pattern of which the groove depth is equal to or deeper than the dishing amount is suitable as the CMP condition of the multi-layer wiring. That is, upon carrying out the CMP for the first-layer (lowest layer) wiring, to begin with, in the foregoing condition, the Cu residue in the dimple due to the low-layer wiring is removed also in the CMP for the wirings of the second layer and the more highly ranked layers with the over-polishing of which the time is identical to that of the polishing for the first layer. At this time, the dishing of the wirings of the second layer and the more highly ranked layers is kept at an identical degree to that of the first layer because the over-polishing time is constant. Accordingly, such a CMP condition is extremely effective in forming the multi-layer wiring. Conversely, upon carrying out the CMP for the second layer in the CMP condition that allows the Cu residue to occur in the pattern of which the groove depth is shallower than the dishing amount, the Cu residue occurs due to the dimple of the groundwork. When the over-polishing time is made longer than that of the first-layer CMP condition in order to remove this Cu residue, the dishing amount of the second-layer wiring becomes larger than that of the first-layer wiring: Such a CMP condition is not suitable as the CMP condition of the multi-layer wiring because the dishing of the more highly ranked layer augments all the more, which causes the wiring resistance to augment. In such a case, it is also forecasted that the microscopic pattern becomes difficult to form with a photo resist because the more highly ranked-layer wiring becomes deeper in the dimple and bump of the substrate surface.

The evaluation method of employing the evaluation substrate in which the depth of the second groove is 105 to 160% of that of the first groove is a method described below. That is, it can be said that, in an X-Y coordinate system, an intersection of a curve that goes through the points obtained by plotting the groove depth in the traverse axis (X-axis) and the dishing amount after the CMP in the vertical axis (Y-axis), respectively, and a straight line expressed by Y=X−A is the maximum dishing amount that is forecasted in the multi-layer wiring. Accordingly, the evaluation method employing the evaluation substrate of the present invention makes it possible to forecast flatness in the case of having formed the multi-layer wiring. And, the CMP condition most suited for forming the multi-layer wiring can be easily decided.

Additionally, in the evaluation substrate of the present invention, the number of the layer of the wiring material, for example, the Cu layer provided in the groove is one (1).

The CMP is carried out for a pattern having the Cu diffusion barrier film and the Cu film provided in the groove thereof having a different depth, thereby to evaluate the Cu residue. Thereby, it can be known whether or not the above CMP is an appropriate CMP. That is, an influence of the dimple and bump of the groundwork due to the low-layer wiring can be evaluated.

And, the troublesome work, for example, forming the multi-layer wiring for evaluation, is not necessitated. Accordingly, for example, the development efficiency in the slurry for the CMP and the CMP process is improved drastically.

In addition hereto, the condition of which the margin for the Cu residue is wide can be selected because confirmation of the margin for the Cu residue in the dimple portion due to the low-layer wiring, which was impossible to make conventionally, can be made. Accordingly, an improvement in the production yield and performance of the LSI is made possible.

BRIEF DESCRIPTION OF THE DRAWINGS

This and other objects, features and advantages of the present invention will become apparent upon a reading of the following detailed description and a drawings, in which:

FIG. 15 is a sectional configuration view of the evaluation pattern that becomes a comparison example.

DETAILED DESCRIPTION OF THE INVENTION

The present invention is an evaluation substrate for evaluating the condition of the CMP that is employed for configuring a semiconductor device having a plurality of wirings in a vertical direction. This evaluation substrate has a substrate in which the first groove and the second groove is formed. The first groove and the second groove differ from each other in respective depth thereof. The second groove is formed in the side of the first groove. The depth of the second groove is shallower than that of the first groove. Particularly, upon viewing the first groove and the second groove from the identical reference plane, the depth of the second groove is shallower than that of the first groove. The depth of the second groove is 5 to 60% of that of the first groove (particularly, 7.5% or more, and further 10% or more. 50% or less, and further 40% or less). Further, (the depth of the second groove) .gtoreq.(the depth of the dishing in the first groove). Or, the depth of the second groove is 105 to 160% of that of the first groove. Additionally, several grooves similar to the second groove (however, the grooves of which the depth differs) are provided. That is, it is desirable that there exist two of the second grooves or more. Desirably, the grooves are approximately identical to each other in its plan shape. The first groove is equivalent to a groove for configuring the wiring in the semiconductor element. The groove is patterned and its pattern is an L & S pattern or an isolated pattern. And, the groove has the material (for example, Cu) of the wiring provided. The material of the wiring provided in the groove, i.e. the wiring, has a one-layer structure. There exists no wiring assuming a two-layer structure.

Upon explaining in more details, the following is obtained.

Figure 1:
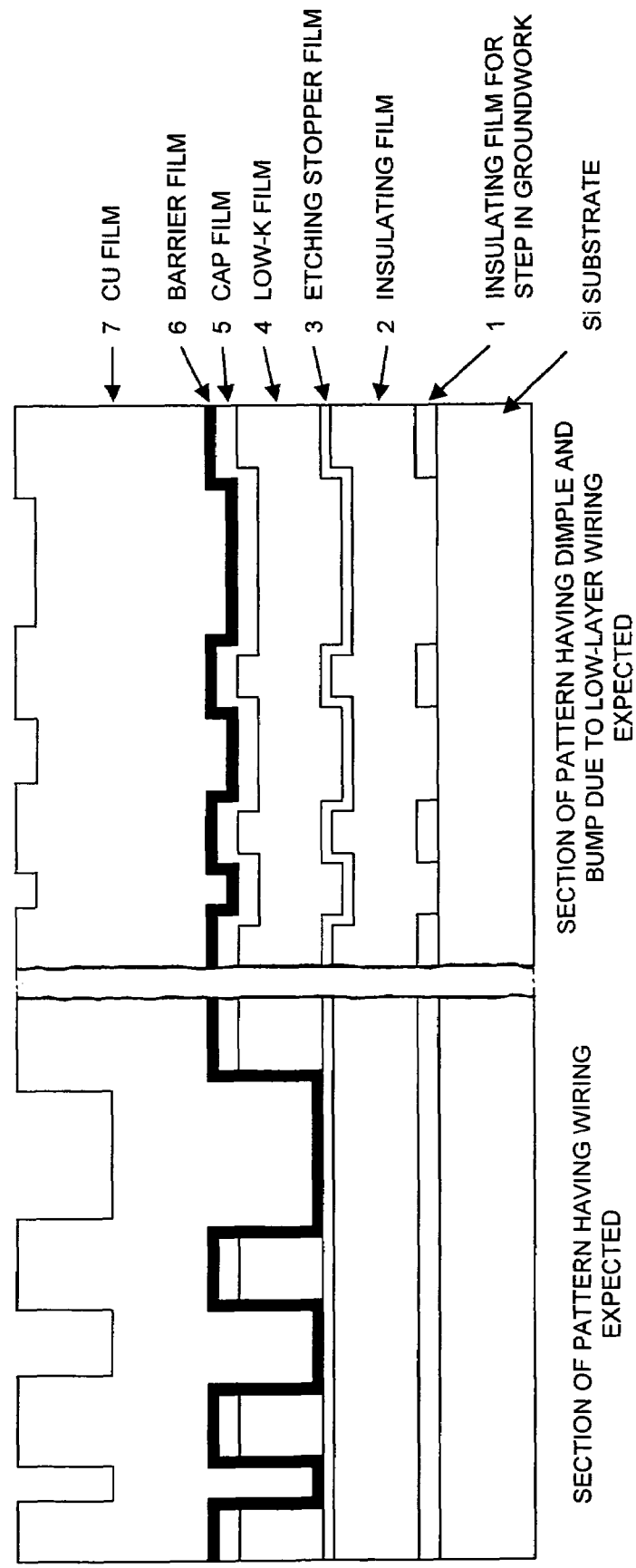
FIG. 1 is a sectional view of an evaluation pattern of a first embodiment.

FIG. 1 is a sectional view of one part of the evaluation substrate that serves as the first embodiment.

Herein, the structure obtained by stacking a cap film on a low-k film (low-dielectric constant film), being an insulating film of the groove having the wiring expected, is employed for the purpose of approaching to the actual wiring structure as closely as possible.

In this regard, after providing a step-in-groundwork insulating-film 1 for configuring the groove having a step in the groundwork expected on the substrate, the above step-in-groundwork insulating-film 1 is etched, thereby to form the groove. Hereafter, an insulating film 2, an etching stopper film 3, a low-k film 4, and a cap film 5 are stacked in this order. And, a photo resist film is provided on the cap film 5, and is exposed/developed, thereby to form the pattern of the wiring. Next, the groove is formed with an etching and an ashing. Additionally, the low-k film 4 is a coat-type insulating film or a plasma-CVD (Chemical Vapor Deposition) film. In a case of employing the coat-type insulating film, an effect upon flattening the dimple and bump due to the low-layer wiring by the coat-type insulating film can be expected. There exists no special limit to the kind of the insulating film in the wiring. For example, there is no necessity for the structure in which the cap film 5 is stacked on low-k film 4. Reference numeral 6 denotes a Cu diffusion barrier film, and 7 denotes a Cu film.

Additionally, in FIG. 1, the right-side pattern is for investigating an influence by a step in the groundwork, and the left-side pattern shows a pattern portion equivalent to wiring.

Figure 2:
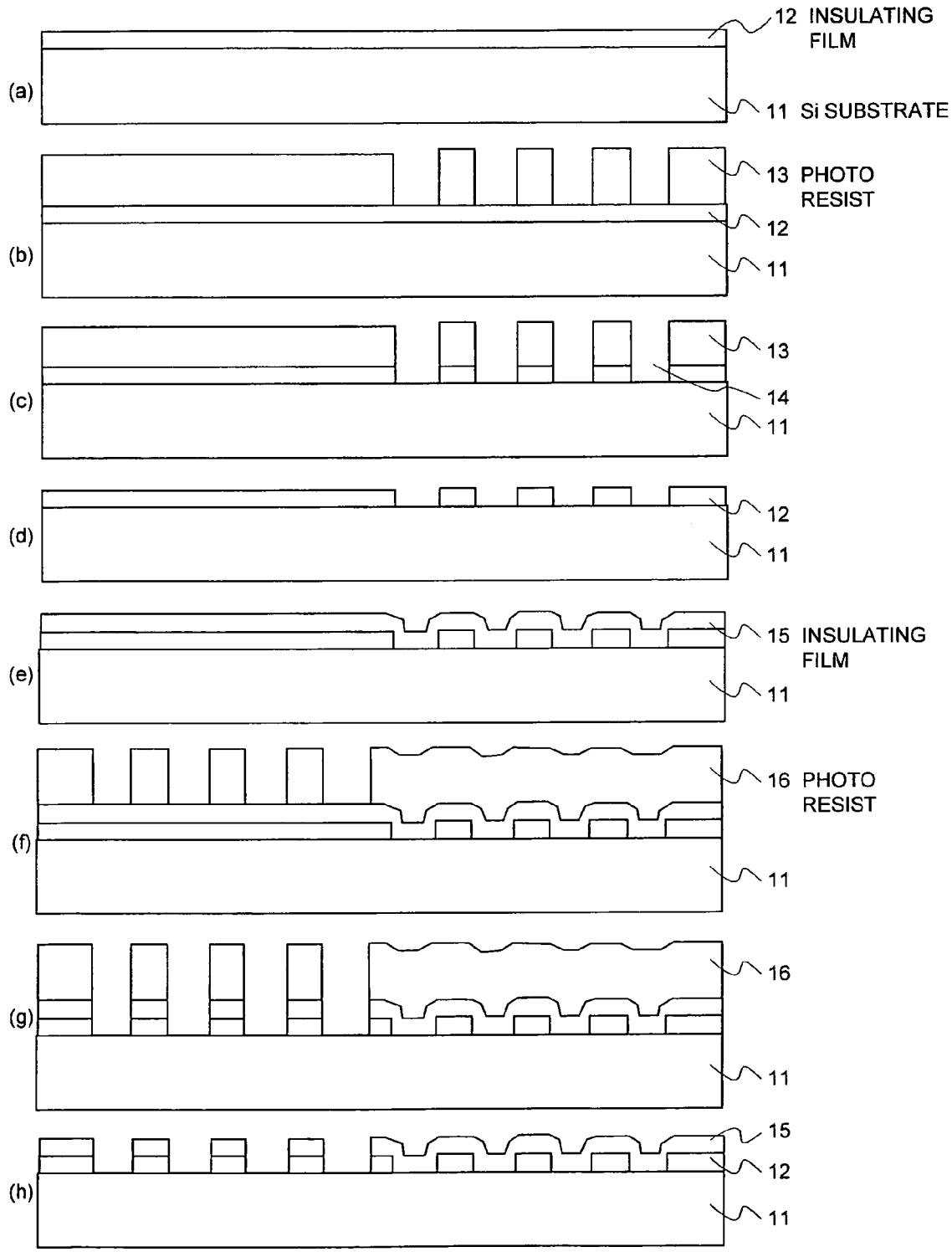
FIG. 2 is a view of a process of forming the evaluation pattern of the first embodiment.

FIG. 2 depicts a process of forming the evaluation substrate.

As shown therein, at first, an insulating film 12, a thickness of which is identical to the depth of the groove that is shallowest in depth, out of the grooves to be produced, is formed on a Si substrate 11 (FIG. 2(a)).

Continuously, a photo resist film 13 is provided by means of coating, and is exposed/developed, thereby to form a predetermined pattern (FIG. 2(b)).

Thereafter, a groove 14 is formed by means of a plasma etching (FIG. 2(c)). The etching is carried out in the condition that an etch selectivity is large for the Si substrate 11. This enables the depth of the groove 14 to be approximately equalized to the thickness of the insulating film 12, thereby allowing dispersion in the groove depth in the substrate plane to be lessened.

Thereafter, the remaining photo resist film 13 is ashed for removal, and is cleaned for removing the residue (FIG. 2(d)).

Next, an insulating film 15 is formed, a thickness of which is equal to a difference between the depth of the second shallowest groove and the thickness of the insulating film 12 (FIG. 2(e)). The identical kind is employed for the insulating film 12 and the insulating film 15.

Thereafter, a photo resist film 16 is provided by means of the coating. Photo resist film 16 is then exposed/developed so that the groove is formed in the region in which no groove has been formed by means of the first etching, thereby to form a predetermined photo resist pattern (FIG. 2(f)).

Next, the groove is formed by means of the etching/ashing, and the photo resist film 16 is removed (FIGS. 2(g) and (h)).

Thereafter, similarly, the process is repeated so that the groove having a necessary depth is formed. Additionally, plural masks are prepared so that the pattern having the identical plane shape is not repeated within the identical chip. In a case where there is a limit to the number of the mask, the pattern having a necessary groove depth may be formed, by changing the groove depth wafer by wafer. There is no special limit to a method of forming a step of the pattern, and the method other than the above-mentioned method may be employed so long as the groove having a predetermined pattern can be formed in different depths.

Figure 3:
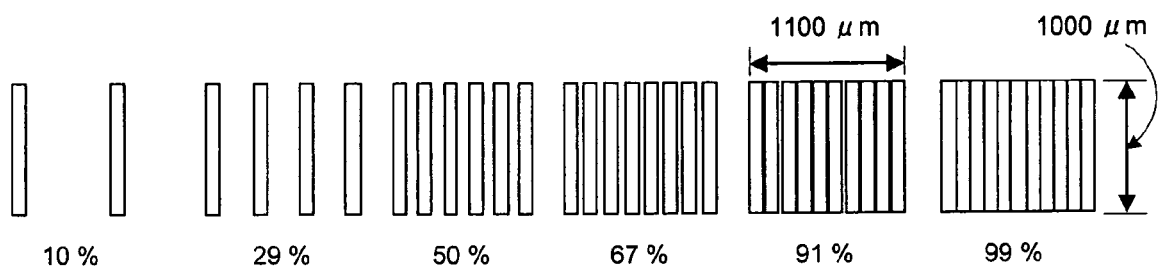
FIG. 3 shows an example of the evaluation pattern.
Figure 4:
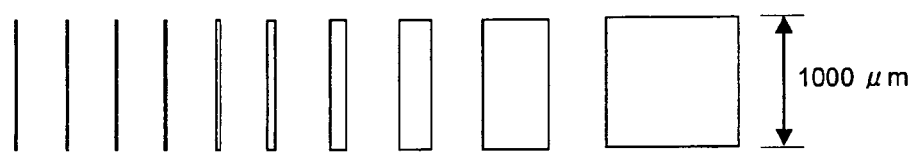
FIG. 4 shows an example of the evaluation pattern.

FIG. 3 shows an example of the L & 1 pattern having a 100 μm wiring in width, and FIG. 4 shows an example of the isolated pattern having 1 to 1000 μm wiring in width.

There is no special limit to a shape or size of the pattern. However, the L & S pattern having a 100 μm or so wiring width of which a wiring occupancy ratio is different, the pattern having the isolated wirings of which the wiring width is 1 to 1000 μm arranged, or the like, is preferable.

After forming the necessary groove, the barrier film for preventing the Cu diffusion is provided in succession to the last ashing cleaning-process. After forming the Cu seed film with a sputtering method, the Cu film is formed with a plating method, then hydrogen-annealed. The thickness of the Cu film that is provided is, as a rule, 1.5 to 3 times or so of the depth of the groove having the wiring expected.

The dimple and bump of the Cu film surface is influenced by the dimple and bump of the groundwork, and the dimple and bump portion of the low-layer wiring and the dimple and bump portion in the wiring portion differ from each other in the shape (see FIG. 1). Forming this with the identical evaluation pattern to simultaneously carry out the CMP makes it possible to obtain the preferred (optimum) condition of the CMP that allows the excellent flatness to be acquired and no Cu residue to occur.

Figure 5:
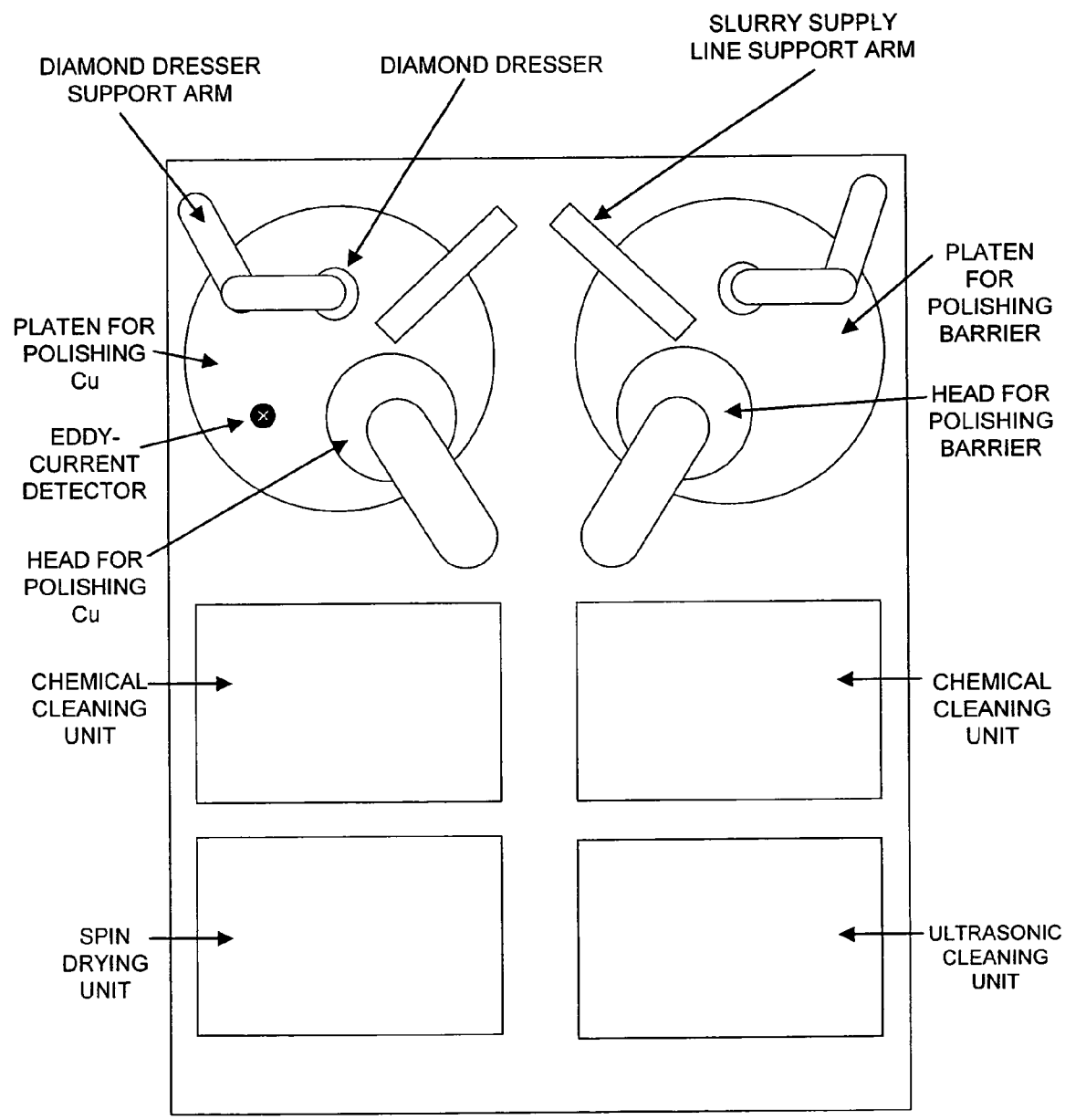
FIG. 5 is a schematic view of the CMP device.

The CMP device is shown in FIG. 5. A head having the substrate that is to be polished held thereto is pushed against a platen having a polishing pad affixed, and the substrate is polished with the slurry supplied to the pad surface while the head and the platen are rotated in the identical direction. A commercially available polyurethane foaming-body pad can be employed as the pad. There are two supply systems of the slurry, which enables two kinds of the slurry to be supplied. A disk, a surface of which has grains of diamond embedded therein is pressed against the polishing pad. Thereafter, the disk and the platen are rotated, thereby to shave the surface of the pad. This prevents clogging of the pad surface due to a reactant produced by the polishing, and abrasive grains of the slurry. This can be done during the polishing or in the intervals of the polishing, responding to a necessity. A change in the film thickness of the Cu film during the polishing is detected with an eddy-current-type end point detector installed in the platen. This makes it possible to polish the film up to a constant film thickness in the first condition, to suspend the polishing for the time being in that place, and continuously, to polish the film in the second condition. The end point at the time that the Cu film has been removed and the Cu diffusion barrier has been exposed can be also detected, and the time of the over-polishing that is carried out in succession hereto can be controlled at a constant level.

This polishing device has the platen and head other than the platen and head for polishing Cu in order to carry out the Cu diffusion barrier polishing in succession to the Cu polishing. Employing this enables the barrier polishing to be performed with the slurry for the barrier. The Cu polishing and the barrier polishing can be continuously performed owing to an automatic transfer in some cases, and only the Cu polishing or only the barrier polishing can be perform individually in some cases, responding to a necessity. After the polishing, a chemical cleaning, an ultrasonic cleaning, etc. are performed owing to the automatic transfer responding to a necessity, and thereafter the substrate is spin-dried and the process is finished.

Figure 6:
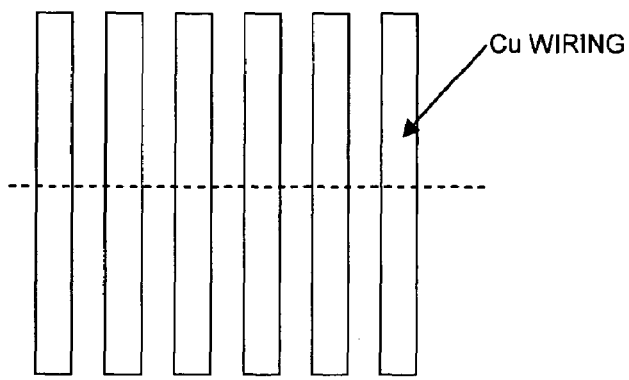
FIG. 6 is a plan view for explaining flatness in the L & S pattern.
Figure 7:
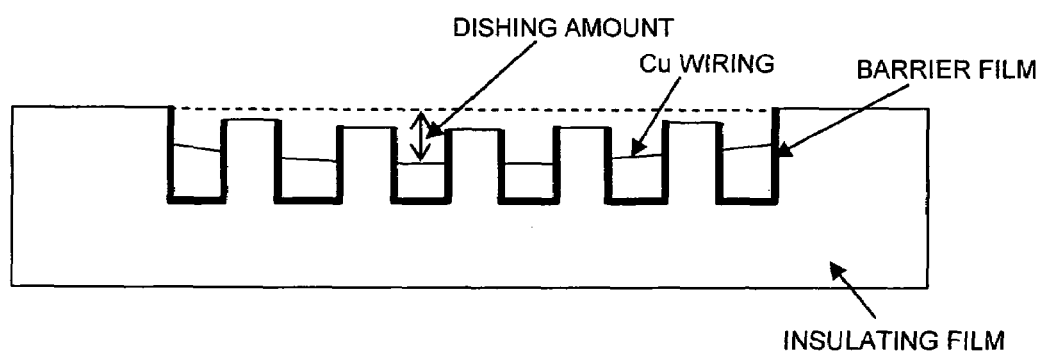
FIG. 7 is a sectional view for explaining flatness in the L & S pattern.
Figure 8:
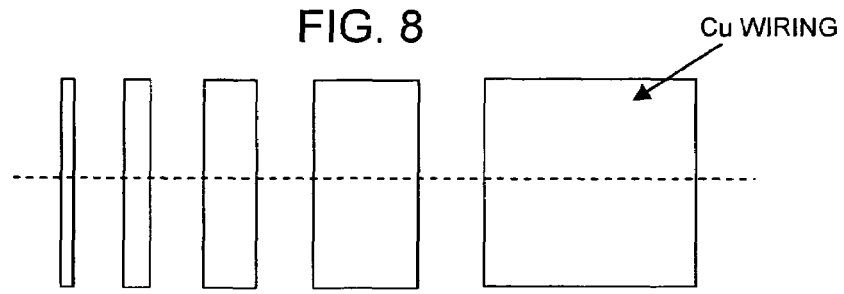
FIG. 8 is a plan view for explaining flatness in the isolated pattern.
Figure 9:
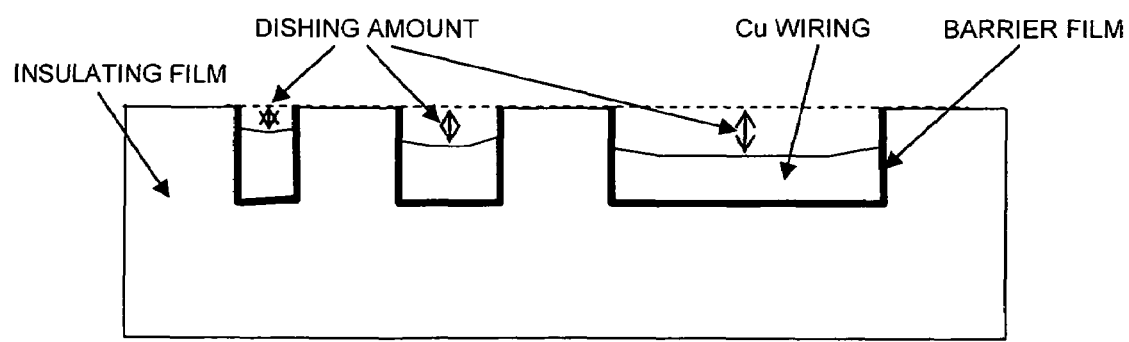
FIG. 9 is a sectional view for explaining flatness in the isolated pattern.

A contact-type step meter can be employed for measuring the flatness after the CMP. The flatness of the pattern having the wiring expected is measured after polishing the Cu film and the Cu diffusion barrier film. With the measurement of the flatness of the L & S pattern, the dishing amount thereof is measured for each block having a constant wiring occupancy ratio. The definition of the flatness of the L & S space pattern is shown in FIG. 6 and FIG. 7 (FIG. 6 is a plan view, and FIG. 7 is a sectional view). In FIG. 7, the situation that the insulating film between the wirings has been shaved with the barrier polishing. In FIG. 8 and FIG. 9 (FIG. 8 is a plan view, and FIG. 9 is a sectional view), the definition of the flatness of the isolated wiring is shown. With the isolated wiring, the dishing amount thereof is measured for each wiring.

The Cu residue is observed with an optical microscope. With the L & S pattern, existence of Cu is observed block by block. With isolated pattern, existence of Cu is observed for each wiring width. There is no special limit to the number of the tips that are observed. However, at least one row in the diametrical direction of the chips is desirably observed.

Hereinafter, the specific example of the evaluation substrate that becomes the first embodiment will be listed for explaining the present invention.

The Si wafer of 300 mm φ was used as the substrate to produce the evaluation substrate having a sectional structure as shown in FIG. 1. With the mask for forming the pattern, one mask was used for forming the wiring groove, and two masks for forming the dimple due to the low-layer wiring. That is, a configuration was made so that three grooves of which the depth differs were possible to form within one tip. The foregoing mask was employed, thereby to produce the two-kind specifications of the evaluation substrates that differ from each other in the groove depth of the pattern having the dimple due to the low-layer wiring expected. It is assumed that the two-kind specifications of the evaluation substrates include a substrate A1 and a substrate B1, respectively. The groove depth of the pattern having the wiring expected in the substrate A1 and the substrate B1 is identical. The insulating film for forming a step in the pattern having the dimple due to the low-layer wiring expected is a SiCN film. The etch rate ratio of the Si substrate and SiCN at the time of having etched them with a gas of which a main component is $CF_4$ is 1:5 or so, and the sufficient selectivity is obtained.

The evaluation substrate A1 was produced in a manner described below.

At first, the step-in-groundwork insulating-film (SiCN film) 1, the thickness of which was 20 nm was formed on the Si substrate of 300 mm φ with the plasma CVD method. And, a mask X1 for forming the dimple was employed, thereby to form a resist film having a predetermined pattern.

Thereafter, a groove M1, a depth of which was 20 nm was formed by means of the etching with the above resist film assumed to be a mask. Additionally, after the etching, the remaining resist film was ashed for removal, and was cleaned for removing the residue.

Next, in addition hereto, the SiCN film (step-in-groundwork insulating-film) of which the thickness was 20 nm was formed to form a resist film having a predetermined pattern by employing the mask Y1 for forming the dimple in a position different from the position of the foregoing groove M1.

Thereafter, a groove N1 of which the depth was 40 nm was formed by means of the etching with the above resist film assumed to be a mask. Additionally, after the etching, the remaining resist film was ashed for removal, and was cleaned for removing the residue.

The process above allows the groove (step) of which the depth is 20 nm and the groove (step) of which the depth is 40 nm to be formed.

Thereafter, the SiO film (insulating film) 2 of which the thickness was 500 nm was provided on the groove M1 and the groove N1. In addition hereto, the SiCN film (etching stopper film) 3 of which the thickness was 50 nm was provided. And, the SiOC film (low-k film) 4 having a thickness of 150 nm was provided. In addition hereto, the SiO film (cap film) 5 having a thickness of 50 nm was stacked. Additionally, these films were formed with the plasma CVD method.

Next, the mask for forming the wiring was employed, thereby to form a resist film having a predetermined pattern in a position different from the positions of the groove M1 and the groove N1. The groove (groove depth: 200 nm) for the wiring having a predetermined pattern was formed by means of the etching with this resist film assumed to be a mask. Thereafter, it was ashed and cleaned. And, a TaN film of which the thickness was 10 nm and a Ta film of which the thickness was 10 nm were provided with the sputtering method. This TaN film/Ta film is the Cu diffusion barrier film 6. After forming the Cu diffusion barrier film 6, the Cu seed film was provided with the sputtering method of 60 nm thickness. The Cu film 7, having a thickness of 540 nm was then provided with the plating method, and hydrogen-annealed for 60 seconds at 220° C. Thereby, the evaluation substrate A1 having a predetermined wiring (groove depth for configuring the wiring: 200 nm) pattern and predetermined groove M1 (depth:20 nm) and N1 patterns (depth:40 nm) was produced.

The evaluation substrate B1 was produced similarly to the evaluation substrate A1. Additionally, the depths of the groove M1 and the groove N1 of the evaluation substrate A1 were 20 nm and 40 nm, respectively, whereas the evaluation substrate B1 differs from the evaluation substrate A1 only in a point that the grooves of which the depth was 60 nm and 80 nm, respectively, were formed (in a point that the thickness of the SiCN film that was firstly provided was assumed to be 60 nm in order to form the groove of which the depth was 60 nm).

The CMP was carried out in a manner described below.

For the slurry, the commercially available slurry for Cu employing silicate abrasive grains was employed. In polishing Cu, hydrogen peroxide water of which the concentration was 30 wt % was pre-mixed with the slurry and used.

The polishing condition is as follows. A polishing pressure: 7 kPa. A platen revolution speed: 60 rpm. A head revolution speed: 61 rpm. A slurry flow: 300 cc/min.

The polishing was carried out with a mixture ratio of the slurry and the hydrogen peroxide water assumed to be 8:2 by a weight ratio until the thickness of the Cu residue film became 300 nm (half) since the start of the polishing.

At the stage that the thickness of the Cu residue film became 300 nm (half), a supply of the slurry was suspended, and the slurry on the pad was washed out with pure water for the time being. Thereafter, the polishing was carried out with a mixture ratio of the slurry and the hydrogen peroxide water assumed to be 4:6 by a weight ratio.

In the polishing with a mixture ratio of the slurry and the hydrogen peroxide water at 8:2, a pattern-dependency of the polishing speed is small, and intra-plane uniformity of the wafer is excellent. On the other hand, in the polishing with a mixture ratio of the slurry and the hydrogen peroxide water at 4:6, a pattern-dependency of the polishing speed is large;

however dissolubility of the step is excellent and an increase in the dishing at the time of the over-polishing is small. This makes it possible that the excellent flatness and the dissolubility of the Cu residue are compatible with each other. The polishing speed of the Cu blanket film is 400 nm/min at the mixture ratio of 8:2, and that of the Cu blanket film is 300 nm/min or so at the mixture ratio of 4:6.

Figure 10:
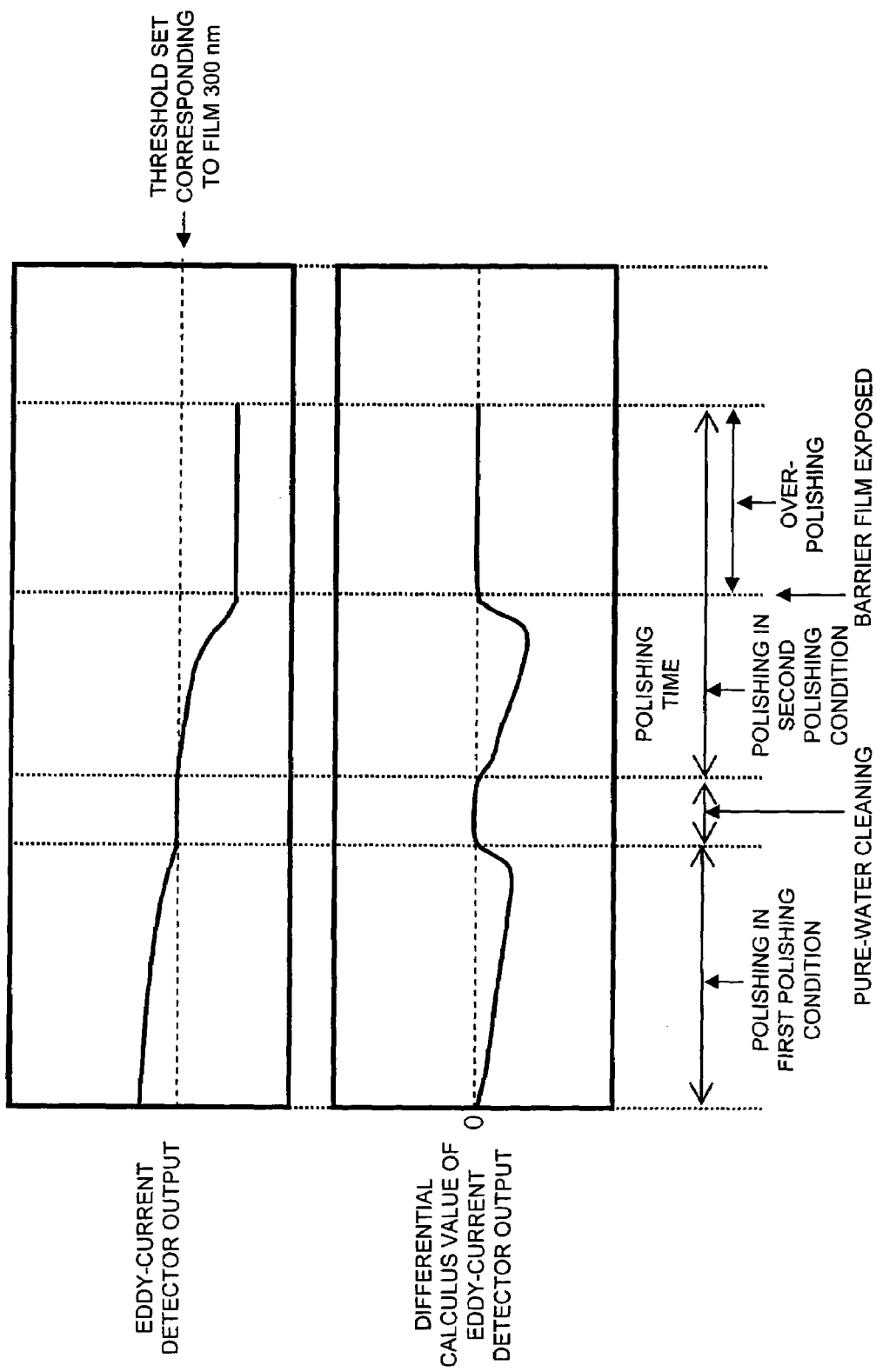
FIG. 10 shows an output of the eddy-current end point detector.

The thickness of the Cu residue film was monitored with the eddy-current end point detector during the polishing of the Cu film. The output from the end point detector allows the time that the thickness of the Cu residue film has become 300 nm, and the time that the Cu film has been removed and the groundwork barrier film has been almost eliminated to be determined. In FIG. 10, the output of the end point detector during the polishing is shown. After the unnecessary Cu film has been almost removed, the output from the end point detector becomes approximately constant. Accordingly, it is assumed that the time that the gradient, i.e. the differential calculus value, of the output from the end point detector has become 0 (zero) during the polishing in the second polishing condition is an end point, and it is assumed that the polishing time after that is an over-polishing time. The over-polishing is carried out continuously in the second polishing condition. After the over-polishing, the slurry on the pad and on the substrate surface was washed out with pure water. Continuously, the substrate was automatically transferred to the platen for polishing the barrier to polish the barrier film by employing the commercially available slurry for the barrier.

The polishing condition is as follows. A polishing pressure: 14 kPa. A platen revolution speed: 60 rpm. A head revolution speed: 61 rpm. A slurry flow: 200 cc/min. The polishing speed of the barrier film in this condition is 80 nm/min for both of Ta and TaN. The polishing speed ratio is barrier film:SiO film:Cu film=2:1:0.2.

After the polishing, the slurry on the pad and on the substrate surface was washed out with pure water. And, it was brush-cleaned and ultrasonic-cleaned by using the commercially available chemical. Thereafter, it was cleaned with water, and spin-dried.

In the CMP of Cu, there is a possibility that the extremely thin Cu film remains on the barrier film at the end point in which the differential calculus value of the output of the eddy-current detector becomes 0 (zero). Particularly, in a case where the dimple and bump exists in the groundwork, Cu is inclined to remain in the dimple, which has to be removed with the over-polishing. At this time, when the over-polishing time is too short, it is feared that the Cu residue cannot be removed completely. Contrarily, when the over-polishing time is too long, the dishing augments.

Thereupon, in order to investigate the optimum over-polishing time in the case that the dimple and bump due to the low-layer wiring existed, the above-mentioned evaluation substrates A1 and B1 were employed and investigated.

Figure 11:
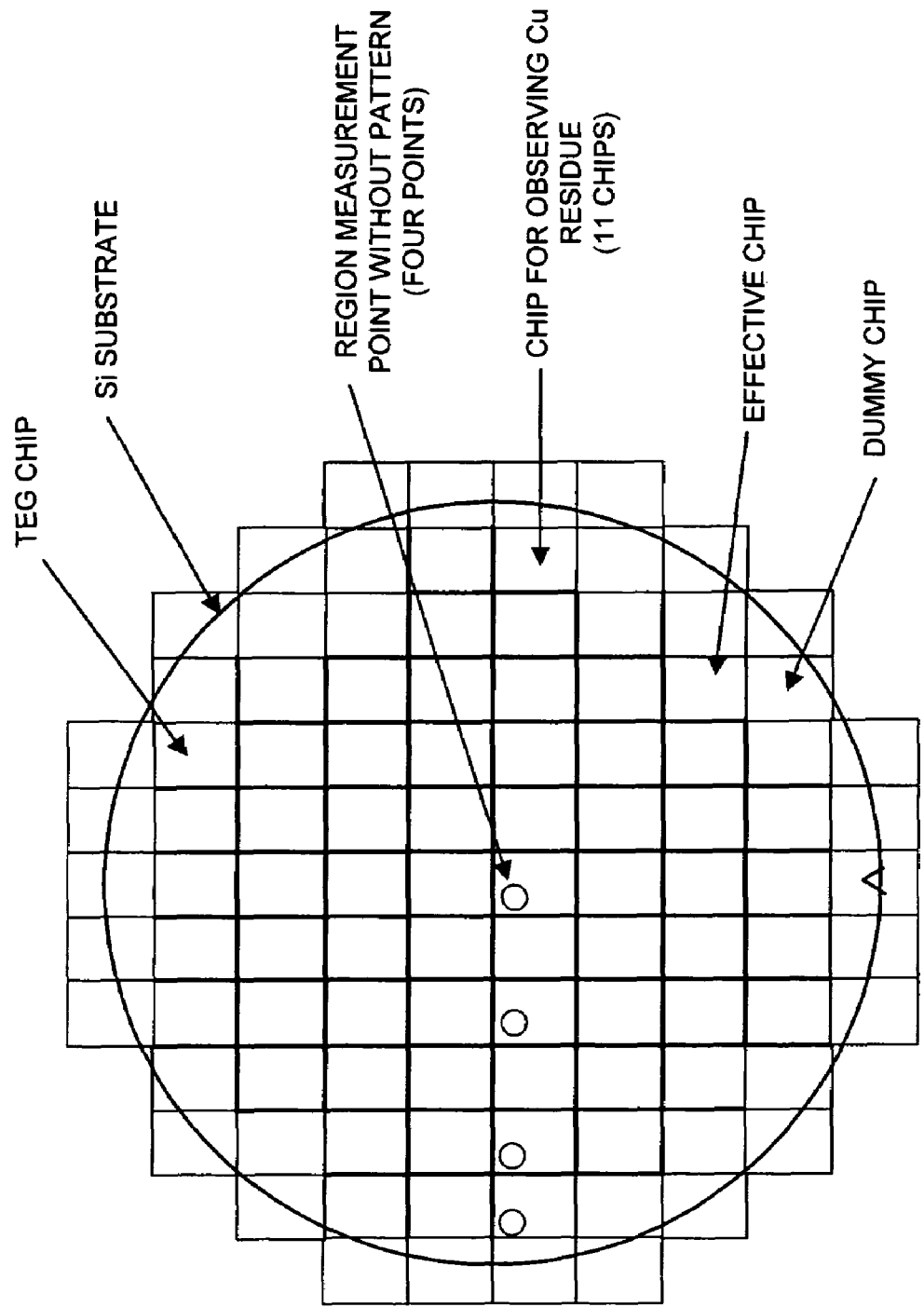
FIG. 11 is an explanatory view of the wafer indicating positions for measuring flatness and positions of chips for observing the Cu residue.

The CMP was carried out with the time of the over-polishing of the Cu film in the above-mentioned evaluation substrates A1 and B1 assumed to be 20 seconds, seconds, 60 seconds, and 80 seconds, respectively. It was assumed that the polishing time of the Cu diffusion barrier film was 20 seconds and 30 seconds, respectively. And, the flatness was measured of the Cu wiring pattern, and the Cu residue was observed in the dimple pattern. The evaluation pattern is the L & S pattern of which the wiring width is 100 Hm shown in FIG. 3. In FIG. 11, a chip array, measurement positions of the flatness, and chips for observing the Cu residue on the wafer are shown. And, the flatness measurement result and the observation result of the Cu residue of the substrates A1 and B1 for which the CMP for the Cu film and the Cu diffusion barrier film was carried out in the above-mentioned eight kinds of the conditions are shown in Table-1 to Table-3. With the dishing amount, an average of the measurement results of the substrates A1 and B1 is shown. The status of "the Cu residue" was observed for each L & S pattern having a constant wiring occupancy ratio and groove depth. And, in the case that "no Cu residue existed" in all of 11 chips shown in FIG. 11, it was determined that "no Cu residue existed". In the case that "the Cu residue was found" even in one of 11 chips, it was determined that "the Cu residue existed".

In Table-1 to Table-3, the maximum groove depth of the dimple pattern having no Cu residue is shown. Cu was removed in the dimple pattern of which the dimple is shallower than this groove depth, irrespective of the polishing condition and the kind of the pattern. Conversely, the Cu residue occurred in the dimple pattern of which the dimple is deeper than this.

In Table-1 to Table-3, the evaluation result about the patterns of which the pattern occupancy ratio is 10%, 50% and 91%, respectively, is shown. The groove depth of the dimple pattern of which the dimple is the shallowest, out of the produced patterns, is 20 nm, whereby in a case where the Cu residue has occurred in its pattern, it is in the yet lower step that the Cu residue is removed. Accordingly, in this case, it is expressed that <20.

TABLE 1

(the flatness result of the L & S of which the pattern occupancy ratio is 10%, and the evaluation result of the Cu residue)

| | | Cu over-polishing time | | | |
|---|---|---|---|---|---|
| | | 20 seconds | 40 seconds | 60 seconds | 80 seconds |
| Barrier polishing time 20 seconds | Dishing amount | 22 | 24 | 36 | 38 |
| | Maximum groove depth having no Cu residue (nm) | <20 | 20 | 40 | 40 |
| Barrier polishing time 30 seconds | Dishing amount | 16 | 21 | 28 | 26 |
| | Maximum groove depth having no Cu residue (nm) | <20 | 20 | 40 | 40 |

TABLE 2

(the flatness result of the L & S of which the pattern occupancy ratio is 50%, and the evaluation result of the Cu residue)

| | | Cu over-polishing time | | | |
|---|---|---|---|---|---|
| | | 20 seconds | 40 seconds | 60 seconds | 80 seconds |
| Barrier polishing time 20 seconds | Dishing amount | 23 | 28 | 40 | 40 |
| | Maximum groove depth having no Cu residue (nm) | <20 | 20 | 40 | 40 |
| Barrier polishing time 30 seconds | Dishing amount | 18 | 25 | 29 | 30 |
| | Maximum groove depth having no Cu residue (nm) | <20 | 20 | 40 | 40 |

TABLE 3

(the flatness result of the L & S of which the
pattern occupancy ratio is 91%, and the evaluation result
of the Cu residue)

| | | Cu over-polishing time | | | |
|---|---|---|---|---|---|
| | | 20 seconds | 40 seconds | 60 seconds | 80 seconds |
| Barrier polishing time 20 seconds | Dishing amount | 40 | 42 | 59 | 60 |
| | Maximum groove depth having no Cu residue (nm) | 20 | 40 | 60 | 60 |
| Barrier polishing time 30 seconds | Dishing amount | 34 | 40 | 47 | 48 |
| | Maximum groove depth having no Cu residue (nm) | 20 | 40 | 60 | 60 |

It can be seen from the tables that, in all of the pattern occupation ratios shown in Table-1 to Table-3, it is in the case where the Cu over-polishing time is 60 seconds or more and the barrier polishing time is 20 second and 30 seconds, respectively, that the maximum groove depth of the dimple pattern having no Cu residue is equal to or larger than the dishing amount. The CMP that is carried out in such a polishing condition is the appropriate (optimum) CMP. It is, in particular, suggested that the CMP condition of which the barrier polishing time is 30 seconds has a large margin for the removability of the Cu residue in the dimple portion due to the dishing of the low-layer wiring because the Cu residue of the dimple pattern of which the dimple is larger by 10 nm or more than the dishing amount has been removed.

Further, from the result of Table-1 to Table-3, it is suggested that the longer the Cu over-polishing time and the barrier polishing time are, the more widely the margin for the Cu residue spreads. However, the longer the polishing time is prolonged, the larger the shaving amount of the Cu wiring becomes, which incurs an increase in wiring resistance. Accordingly, it is thought that the CMP condition that allows the Cu residue of the groove of which the step amount is 1.0 to 1.6 times or so of the dishing amount to be removed is best suited.

In a case of having applied the CMP condition as mentioned above for forming the multi-layer wiring, the dishing of the wiring of each layer is kept at an approximately constant level because the over-polishing time for each layer is constant. Further, it is thought that the above CMP condition has a sufficient margin for the Cu residue because the Cu residue of the dimple pattern of which dimple is deeper than the depth of the dishing of the low-layer wiring is also removable.

By carrying out the CMP for the above-mentioned optimum Cu over-polishing time and Cu diffusion barrier film polishing time, it was actually confirmed whether or not the multi-layer wiring was formable. That is, the excellent result that no short circuit occurred between the wirings and the yield of 100% was obtained as a result of forming the six-layer wiring having various kinds of the L & S patterns ranging from the L & S of 90 nm/90 nm to the L & S of 25 µm/25 µm to measure an inter-wiring dielectric pressure of the sixth-layer wiring.

On the other hand, making the similar investigation with the conventional method necessitates forming the high-layer wiring after carrying out the CMP for the low-layer wiring to carry out the CMP again, which prevents the prompt evaluation from being made. Further, the appropriate polishing condition cannot be set because the margin cannot be confirmed in such a manner that a degree of the depth of the dimple at which Cu is removable is determined by making a comparison with the dishing amount of the low-layer wiring.

Next, the specific example of the evaluation substrate that becomes a second embodiment will be listed for explaining the present invention.

The evaluation substrate similar to the evaluation substrate shown in FIG. 1 was prepared. However, the evaluation substrate that serves as the second embodiment and the evaluation substrate that serves as the first embodiment (see FIG. 1) are identical to each other except that the depth of the groove differs. The groove of the evaluation substrate of this second embodiment can be formed, by employing the method (see FIG. 2) of forming the groove of the evaluation substrate that serves as the first embodiment. Further, the pattern of the groove of the evaluation substrate that serves as the second embodiment is similar to that of the groove of the evaluation substrate that serves as the first embodiment (see FIG. 3 and FIG. 4). The device shown in FIG. 5 is employed for the CMP. The definition of the dishing amount etc. is one shown in FIG. 6 to FIG. 9.

A specific example of the evaluation substrate that exemplifies this second embodiment will be explained.

The Si wafer of 300 mm φ was used as the substrate to produce the evaluation substrate having a sectional structure as shown in FIG. 1. With the mask for forming the pattern, one mask was used for forming the wiring groove, and two masks for forming the dimple due to the low-layer wiring. That is, a configuration was made so that three grooves of which the depth differs were possible to form within one tip. The foregoing mask was employed, thereby to produce the two-kind specifications of the evaluation substrates that differed from each other in the groove depth of the pattern having the dimple due to the low-layer wiring expected. It is assumed that the two-kind specifications of the evaluation substrates are a substrate A2 and a substrate B2, respectively. The groove depth of the pattern having the wiring expected in the substrate A2 and the substrate B2 is 200 nm, respectively. The insulating film for forming a step of the pattern having the dimple due to the low-layer wiring expected is a SiCN film. The etch rate ratio of the Si substrate and SiCN at the time of having etched them with a gas of which a main component is $CF_4$ is 1:5 or so, and the sufficient selectivity is obtained.

The evaluation substrate A2 was produced in a manner described below.

At first, the step-in-groundwork insulating-film (SiCN film) 1 of which the thickness was 20 nm was formed on the Si substrate of 300 mm φ with the plasma CVD method. And, a mask X2 for forming the dimple was employed, thereby to form a resist film having a predetermined pattern.

Thereafter, a groove M2 of which the depth was 20 nm was formed by means of the etching with the above resist film assumed to be a mask. Additionally, after the etching, the remaining resist film was ashed for removal, and cleaned for removing the residue.

Next, in addition hereto, the SiCN film (step-of-groundwork insulating-film) of which the thickness was 20 nm was formed to form a resist film having a predetermined pattern in a position different from the position of the foregoing groove M2 by employing a mask Y2 for forming the dimple.

Thereafter, a groove N2 of which the depth was 40 nm was formed by means of the etching with the above resist film assumed to be a mask. Additionally, after the etching, the remaining resist film was ashed for removal, and cleaned for removing the residue.

The process above allows the groove (step) of which the depth is 20 nm and the groove (step) of which the depth is 40 nm to be formed.

Thereafter, the SiO film (insulating film) 2, a thickness of which was 500 nm, was provided on the groove M2 and the groove N2. In addition hereto, the SiCN film (etching stopper film) 3, a thickness of which was 50 mm, was provided. And, the SiOC film (low-k film) 4, a thickness of which was 150 nm, was provided. In addition hereto, the SiO film (cap film) 5, a thickness of which was 50 nm, was stacked. Additionally, these films were formed with the plasma CVD method.

Next, the mask for forming the wiring was employed, thereby to form a resist film having a predetermined pattern. The groove (the groove depth was 200 nm in the position in which it did not overlap with the groove M2 and the groove N2, the groove depth was 220 nm in the position in which it overlapped with the groove M2, and the groove depth was 240 nm in the position in which it overlapped with the groove N2) for the wiring having a predetermined pattern was formed by means of the etching with this resist film assumed to be a mask. Hereafter, it was ashed and cleaned. And, a TaN film, a thickness of which was 10 nm, and a Ta film, a thickness of which was 10 nm, were provided with the sputtering method. This TaN film/Ta film is the Cu diffusion barrier film 6. After forming the Cu diffusion barrier film 6, the Cu seed film was provided with the sputtering method of 60 nm thickness. Thereafter, the Cu film 7, a thickness of which was 540 nm, was provided with the plating method, and hydrogen-annealed for 60 seconds at 220° C. Thereby, the evaluation substrate A2 having groove patterns of which the depth was 200 nm, 220 nm, and 240 nm, respectively, was produced.

The evaluation substrate B2 was produced similarly to the evaluation substrate A2. Additionally, the depth of the groove M2 and the groove N2 of the evaluation substrate A2 was 20 nm and 40 nm, respectively, whereas the evaluation substrate B2 differs from the evaluation substrate A2 only in a point that the grooves of which the depth was 60 nm and 80 nm, respectively, were formed (i.e., in a point that the thickness of the SiCN film that was firstly provided was assumed to be 60 nm in order to form the groove of which the depth was 60 nm). That is, the evaluation substrate B2 having groove patterns of which the depth was 200 nm, 260 nm, and 280 nm, respectively, was produced.

Next, the CMP was carried out in a manner described below.

For the slurry, the commercially available slurry for Cu employing silicate abrasive grains was employed. In polishing Cu, hydrogen peroxide water of which the concentration was 30 wt % was pre-mixed with the slurry and used.

The polishing condition is as follows. A polishing pressure: 7 kPa. A platen revolution speed: 60 rpm. A head revolution speed: 61 rpm. A slurry flow: 300 cc/min.

The polishing was carried out with a mixture ratio of the slurry and the hydrogen peroxide water assumed to be 8:2 by a weight ratio until the thickness of the Cu residue film became 300 nm (half) since the start of the polishing.

At the stage that the thickness of the Cu residue film became 300 nm (half), a supply of the slurry was suspended to wash out the slurry on the pad with pure water for the time being. Hereafter, the polishing was carried out with a mixture ratio of the slurry and the hydrogen peroxide water assumed to be 4:6 by a weight ratio.

In the polishing with a mixture ratio of the slurry and the hydrogen peroxide water at 8:2, a pattern-dependency of the polishing speed is small, and intra-plane uniformity of the wafer is excellent. On the other hand, in the polishing with a mixture ratio of the slurry and the hydrogen peroxide water at 4:6, the pattern-dependency of the polishing speed is large; however dissolubility of the step is excellent and an increase in the dishing at the time of the over-polishing is small. This makes it possible that the excellent flatness and the dissolubility of the Cu residue are compatible with each other. The polishing speed of the Cu blanket film is 400 nm/min at the mixture ratio of 8:2, and that of the Cu blanket film is 300 nm/min or so at the mixture ratio of 4:6.

The film thickness of the Cu residue was monitored with the eddy-current end point detector during the polishing of the Cu film. The output from the end point detector allows the time that the film thickness of the Cu residue has become 300 nm, and the time that the Cu film has been removed and the groundwork barrier film has been almost eliminated to be determined. In FIG. 10, the output of the end point detector during the polishing is shown. After the unnecessary Cu film has been almost removed, the output from the end point detector becomes approximately constant. Accordingly, it is assumed that the time that the gradient, i.e., the differential calculus value, of the output from the end point detector has become 0 (zero) during the polishing in the second polishing condition is an end point, and it is assumed that the polishing time after that is an over-polishing time. The over-polishing is carried out continuously in the second polishing condition. After the over-polishing, the slurry on the pad and on the substrate surface was washed out with pure water. Continuously, the substrate was automatically transferred to the platen for polishing the barrier, and the commercially available slurry for the barrier was used, thereby to polish the barrier film.

The polishing condition is as follows. A polishing pressure: 14 kPa. A platen revolution speed: 60 rpm. A head revolution speed: 61 rpm. A slurry flow: 200 cc/min.

The polishing speed of the barrier film in this condition is 80 nm/min for both of Ta and TaN. The polishing speed ratio is barrier film:SiO film:Cu film=2:1:0.2.

After the polishing, the slurry on the pad and on the substrate surface was washed out with pure water. And, it was brush-cleaned and ultrasonic-cleaned by using the commercially available chemical. Thereafter, it was cleaned with water, and spin-dried.

In the CMP of Cu, there is a possibility that the extremely thin Cu film remains on the barrier film at the end point in which the differential calculus value of the output of the eddy-current detector becomes 0 (zero). Particularly, in a case where the dimple and bump exists on the groundwork, Cu is inclined to remain in the dimple, which has to be removed with the over-polishing. At this time, when the over-polishing time is too short, it is feared that the Cu residue cannot be removed completely. Contrarily, when the over-polishing time is too long, the dishing augments.

Figure 12:
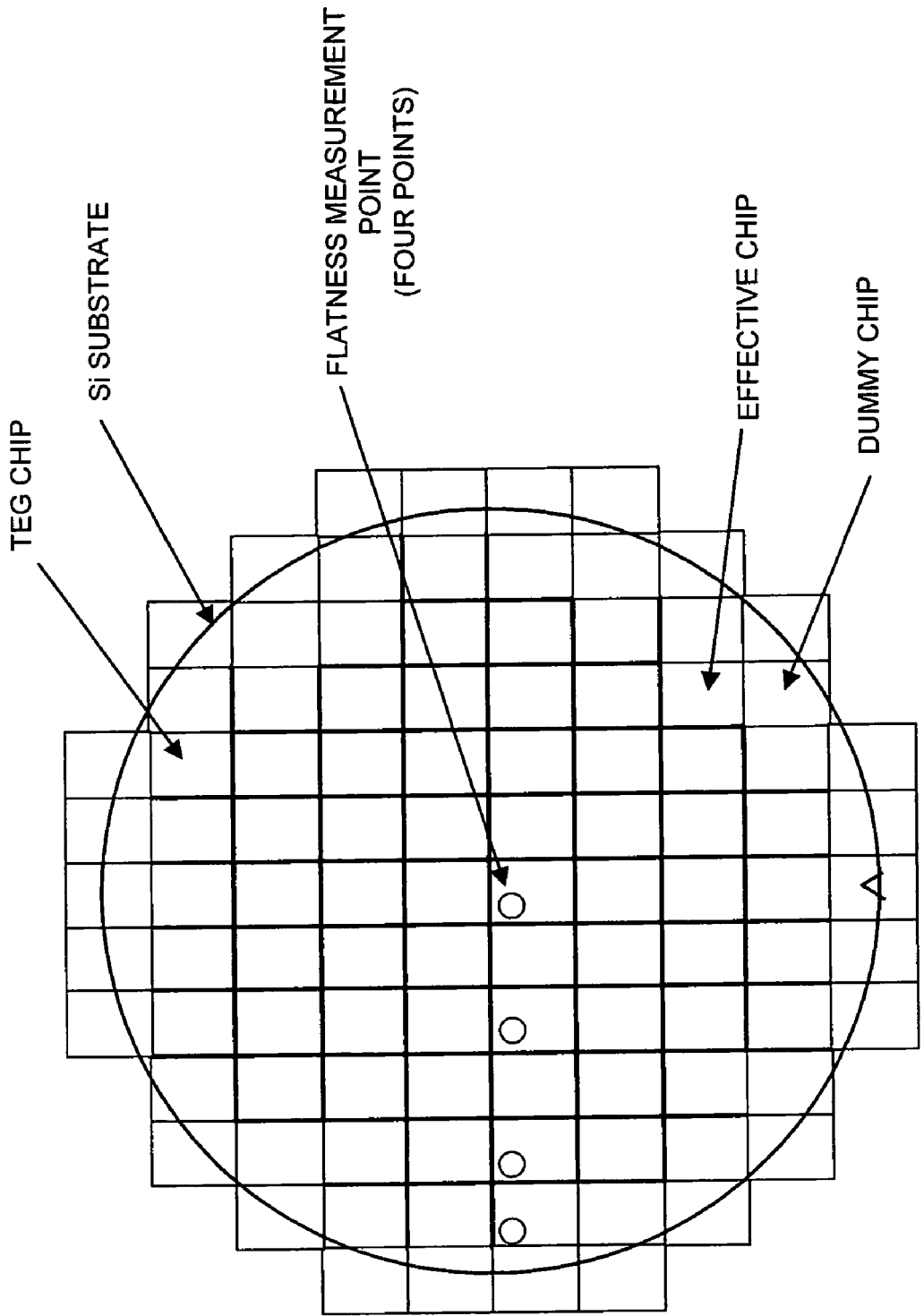
FIG. 12 is an explanatory view of positions for measuring flatness and positions of chips for observing the Cu residue in a second embodiment.

In the following, it was assumed that the Cu over-polishing time was 40 seconds and the barrier film polishing time was 30 seconds. After the CMP, the flatness of the wiring patterns having respective groove depths was measured. The L & S pattern, a wiring width of which was 100 μm, shown in FIG. 3, was employed as the flatness measurement pattern. In FIG. 12, the chip array and the measurement positions of the flatness on the wafer are shown. The flatness measurement result is shown in Table-4 (an average of the measurement results of four points).

TABLE 4

| | | Groove depth (nm) | | | | |
|---|---|---|---|---|---|---|
| | | 200 | 220 | 240 | 260 | 280 |
| Dishing amount | Wiring concentration 10% | 24 | 26 | 28 | 30 | 31 |
| | Wiring concentration 50% | 28 | 31 | 33 | 36 | 36 |
| | Wiring concentration 91% | 58 | 58 | 64 | 70 | 72 |

Figure 13:
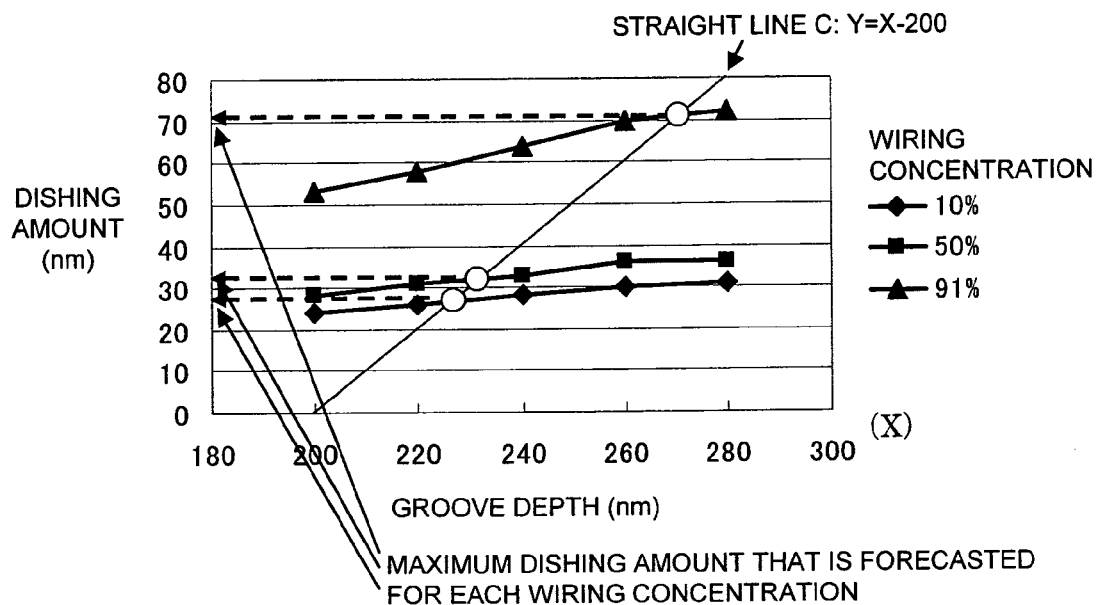
FIG. 13 is a graph for calculating the maximum dishing amount.

It is in FIG. 13 that data of Table-4 is illustrated with a graph. FIG. 13 is a view having the groove depth and the dishing amount plotted in the traverse axis (X-axis) and in the vertical axis (Y-axis), respectively. In FIG. 13, therewith, a straight line C of Y (dishing amount)+groove depth 200 (nm)= X (groove depth), i.e. Y=X−200 is shown. It is forecasted that the dishing amount at an intersection of this straight line C and a curve connecting the points indicating the dishing amount becomes the maximum of the dishing amount that is forecasted in the case that the wirings have overlapped with each other in the multi-layer wiring. It is thought that the smaller a difference is between this maximum dishing amount that is forecasted, and the dishing amount of the wiring having a groove depth of A=200 nm, which is expected in the case that the wirings do not overlap with each other, the smaller is a fluctuation in the dishing due to the wiring, which is suitable as the CMP condition of the multi-layer wiring.

Figure 14:
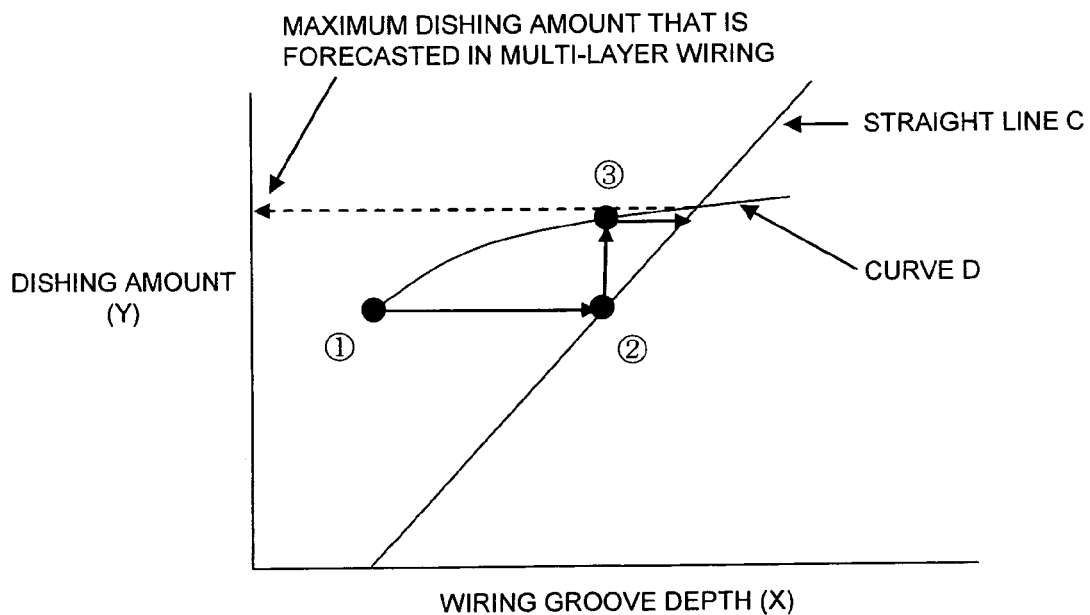
FIG. 14 is an explanatory view for calculating the maximum dishing amount.

Additionally, the reason why the intersection of the straight line C and a curve D of the dishing amount becomes the maximum of the dishing amount that is expected in the case that the wirings have overlapped with each other in the multi-layer wiring will be explained by employing FIG. 14. Upon assuming that the point obtained by plotting the dishing of the first-layer wiring is 1, it follows that the groove depth of the second-layer wiring piled thereon is a value of the X-axis of the point 2. Next, the dishing amount after carrying out the CMP for the wiring having the groove depth of point 2 is expressed by a point 3. It can be seen that the dishing in the case of similarly having stacked the wirings approaches the intersection of the straight line C and the curve D as shown in FIG. 14. Accordingly, the maximum of the dishing amount in the case of having formed the multi-layer wiring is the intersection of the straight line C and the curve D.

The maximum dishing amount that is forecasted in the case of having formed the multi-layer wiring having the pattern having respective wiring concentrations and a difference between the maximum dishing amount that is forecasted, and the dishing amount of the groove of which the groove depth is 200 nm, which are obtained from FIG. 13, are shown in Table-5.

TABLE 5

| | | Dishing amount (E) of the groove of which the depth is 200 nm | Maximum dishing amount (F) that is forecasted | (E)-(F) |
|---|---|---|---|---|
| Wiring concentration (%) | 10 | 24 nm | 26.5 nm | 2.5 nm |
| | 50 | 28 nm | 32 nm | 4 nm |
| | 91 | 53 nm | 71 nm | 18 nm |

It is forecasted from Table-5, that dispersion in the dishing amount due to the wiring layer of the multi-layer wiring is small because the value of (E)-(F) is small in the pattern of which the wiring concentration is 10% and the pattern of which the wiring concentration is 50%. On the other hand, it is forecasted that dispersion in the dishing amount is large because the value of (E)-(F) is large in the pattern of which the wiring concentration is 91%. Accordingly, in this case, it is thinkable that an improvement in the CMP condition, and a limit to (an improvement in) an arrangement of the wiring at the design stage of the LSI are necessitated, whereby the development in line with this viewpoint has to be propelled.

Additionally, making the evaluation as mentioned above in the evaluation substrate for forming the two-layer wiring shown in FIG. 15 necessitates controlling the dishing amount of the low-layer wiring in order to control the groove depth of the high-layer wiring at a level of the necessary depth. However, the step amount due to the dishing by the CMP is not suitable for evaluation because the dispersion in the wafer plane and between the wafers is larger as compared with the step that is formed by the etching. Further, the step amount that is formed by the dishing depends upon a performance of the CMP, whereby the controllable range is limited, and the necessary step amount is not always obtained.

What is claimed is:

1. An evaluation substrate for evaluating a condition of a CMP that is employed for configuring a semiconductor device having a plurality of wirings in a vertical direction, said evaluation substrate comprising:
    a substrate;
    a first groove formed in said substrate;
    a second groove formed in said substrate; and
    a material of the wirings provided in said first groove and said second groove, a depth of said first groove differing from that of said second groove, an upper boundary defining said first groove being arranged substantially level with a corresponding upper boundary defining said second groove wherein said first groove is equivalent to a groove for configuring said wiring, and said material of said wiring has a single one-layer structure which extends over a surface of said substrate and is contiguous with the material in said first groove and said second groove, and said substrate not having another conductive layer besides said single one-layer structure.

2. The evaluation substrate as claimed in claim 1, wherein said first and second grooves have an almost identical plan shape to one another.

3. The evaluation substrate as claimed in claim 1, wherein each of said first and second grooves is configured in a pattern, wherein said pattern is one of an L & S pattern and an isolated pattern.

4. The evaluation substrate as claimed in claim 1, wherein said material of said wiring is one of Cu and a Cu alloy.

5. The evaluation substrate as claimed in claim 1, wherein:
    said second groove is formed on a side of said first groove, and
    upon viewing said first groove and said second groove from an identical reference plane, said depth of said second groove is shallower than that of said first groove.

6. The evaluation substrate as claimed in claim 5, wherein said depth of said second groove is 5 to 60% of that of said first groove.

7. The evaluation substrate as claimed in claim 5, wherein said depth of said second groove is configured to be greater than, or equal to, a depth of a dishing in said first groove.

8. The evaluation substrate as claimed in claim 5, further comprising an other groove similar to said second groove except that said other groove differs in depth, wherein a depth of said other groove is 5 to 60% of that of said first groove.

9. The evaluation substrate as claimed in claim 1, wherein:
said second groove is formed on a side of said first groove, and
upon viewing said first groove and said second groove from an identical reference plane, said depth of said second groove is deeper than that of said first groove.

10. The evaluation substrate as claimed in claim 9, wherein said depth or said second groove is 105 to 160% of that of said first groove.

11. The evaluation substrate as claimed in claim 9, further comprising an other groove similar to said second groove except that said other groove differs in depth, wherein a depth of said other groove is 105 to 160% of that of said first groove.

12. An evaluation substrate for evaluating a condition of a CMP that is employed for configuring a semiconductor device having a plurality of wirings in a vertical direction, said evaluation substrate comprising:

a substrate;
a first groove formed in said substrate;
a second groove formed in said substrate; and
a material of the wirings provided in said first groove and said second groove, a depth of said first groove differing from that of said second groove, said material extending beyond an upper boundary of each of said first groove and said second groove so as to form a layer covering a surface of said substrate which is contiguous with said material in said first groove and said second groove, said material forming one single layer and said substrate being without other conductive layers.

13. The evaluation substrate as claimed in claim 12, wherein said material is present as a coating on said substrate adjacent to said first and second grooves.

* * * * *